(12) United States Patent
Blanchard

(10) Patent No.: US 7,839,133 B2
(45) Date of Patent: Nov. 23, 2010

(54) REMOTE CONTINUITY AND CABLE IDENTIFIER AND POLARITY CHECKER SYSTEM AND METHOD

(75) Inventor: Joseph Blanchard, Newton, MA (US)

(73) Assignee: Extech Instruments Corporation, Waltham, MA (US)

( * ) Notice: Subject to any disclaimer, the term of this patent is extended or adjusted under 35 U.S.C. 154(b) by 215 days.

(21) Appl. No.: 11/854,710

(22) Filed: Sep. 13, 2007

(65) Prior Publication Data

US 2008/0061762 A1    Mar. 13, 2008

Related U.S. Application Data

(60) Provisional application No. 60/825,437, filed on Sep. 13, 2006.

(51) Int. Cl.
  *G01R 19/00* (2006.01)
  *G01R 31/08* (2006.01)

(52) U.S. Cl. .................. 324/66; 324/523; 324/524; 324/67

(58) Field of Classification Search .............. 324/563, 324/524, 523, 66
  See application file for complete search history.

(56) References Cited

U.S. PATENT DOCUMENTS

| | | | | |
|---|---|---|---|---|
| 4,924,177 A | * | 5/1990 | Mulz | 324/133 |
| 5,387,899 A | * | 2/1995 | DiLauro et al. | 340/514 |
| 5,627,474 A | * | 5/1997 | Baudisch | 324/539 |
| 5,754,624 A | * | 5/1998 | Sullivan et al. | 379/27.01 |
| 5,847,557 A | * | 12/1998 | Fincher et al. | 324/66 |
| 6,002,247 A | * | 12/1999 | Watkins | 324/66 |
| 6,201,385 B1 | * | 3/2001 | Johnson | 324/133 |
| 6,333,625 B1 | * | 12/2001 | Linder | 324/66 |
| 6,433,530 B1 | | 8/2002 | Pool | |
| 6,646,454 B2 | * | 11/2003 | Watkins | 324/674 |
| 6,750,643 B2 | * | 6/2004 | Hwang et al. | 324/66 |
| 7,307,408 B2 | * | 12/2007 | Porcu et al. | 324/66 |
| 2004/0000898 A1 | * | 1/2004 | Pool et al. | 324/66 |

\* cited by examiner

Primary Examiner—Timothy J Dole
Assistant Examiner—John Zhu
(74) Attorney, Agent, or Firm—Haynes and Boone, LLP

(57) ABSTRACT

An electrical continuity test system with a tester and a remote probe. The tester includes circuitry for creating a pulsed current, an output for connection to a local end of a first test conductive element, to inject the pulses into the first test conductive element, an input for connection to a local end of a second test conductive element, and a visual and/or aural indication when the injected pulses are present on the second test conductive element. The remote probe includes an input for connection to a remote end of a first unidentified conductive element, an output for connection to a remote end of a second unidentified conductive element, a first visual and/or aural indication when the first unidentified conductive element is the first test conductive element, and a different visual and/or aural indication when the first unidentified conductive element is the second test conductive element.

20 Claims, 4 Drawing Sheets

REMOTE CONTINUITY AND CABLE IDENTIFIER AND POLARITY CHECKER SYSTEM AND METHOD

CROSS-REFERENCE TO RELATED APPLICATION

This application claims priority of Provisional Application Ser. No. 60/825,437, filed Sep. 13, 2006, the entire contents of which are incorporated herein by reference.

FIELD OF THE INVENTION

This invention relates to an electrical system that determines both continuity and polarity.

BACKGROUND OF THE INVENTION

Continuity checking devices typically include a battery power source and a light and/or buzzer. When the device is coupled to a conductive path, electricity flows through the path, causing the light to light and the buzzer to sound. These devices work well when the user is close enough to see the light or hear the buzzer.

There are situations in which a technician needs to identify both ends of one or more cables or sets of conductors among two or more such conductors. If these conductors are lengthy, when the technician is at the far end of the conductors, the technician may not be able to see or hear a continuity tester coupled to the near end. In these situations, either two people must be involved, or the technician must travel back and forth between the two ends in order to complete the conductor identification task.

SUMMARY OF THE INVENTION

There is thus the need for a continuity test system that allows identification of conductors without the need for two technicians, or for one technician to travel back and forth between remote ends of such conductors.

This invention relates to a continuity test system that enables a user to identify and determine the polarity of conductive elements such as wires or cables (locally) out of a group of conductive elements, and to identify conductive elements such as wires or cables extending out to distant locations. This enables one person to identify and label the conductive elements under test with only one trip to the other end of the conductive elements.

The invention enables a person working alone to easily identify one or more conductive elements such as cables or wires out of two or more, and to find and label both ends of long distance runs.

This invention uses a two-part system, with a local tester and a remote probe. The tester has a pulse generator with internal battery and is attached to one end of the cable(s) or wires under test. The preferred embodiment of the remote probe has a passive bi-color LED indicator and is attached to the other end of the cable or wires under test. A person simply clips the tester leads to both wires on the "near" end of an un-powered cable, then goes to the "far" end of the cable and clips the remote probe leads onto the conductors. If the remote probe flashes, the cable is identified. Both ends of the cable can then be labeled. If the probe doesn't flash, the user continues testing other cables until finding the right one.

This system can also be used to identify the polarity of wires in a cable or group of cables. The probe can have two colors of lights, e.g., red and green. If continuity is found the probe will flash one of the two colors. For example if the probe flashes green, the wires are identified and can be labeled with the same numbers as on the probe leads they are attached to, and if it flashes red, the polarity of the wires under test by the probe are reversed from the tester connections, and so can be labeled with numbers opposite to those on the probe leads.

The inventive system can thus be used with any cable with two or three conductors, or two or three multi-conductor cables. The system can be used to identify both ends of such conductive elements, with a single technician making only one trip to the far end of the conductive elements under test.

This invention features an electrical continuity test system and method. The test system comprises a tester and a remote probe. The tester comprises circuitry for creating a pulsed current, and an output for connection to a local end of a first test conductive element, to inject the pulses into the first test conductive element. There is also an input for connection to a local end of a second test conductive element, and a visual and/or aural indication when the injected pulses are present on the second test conductive element. The remote probe comprises an input for connection to a remote end of a first unidentified conductive element, an output for connection to a remote end of a second unidentified conductive element. The probe also has a first visual and/or aural indication when the first unidentified conductive element is the first test conductive element, and a different visual and/or aural indication when the first unidentified conductive element is the second test conductive element.

The tester preferably includes both visual and aural indication. The tester may include an opto-isolator that is electrically connected to the tester input and enables the visual and/or aural indication. The tester circuitry may comprise a timer integrated circuit. The remote probe first visual and/or aural indication may comprise one color of a two-color LED, while the second visual and/or aural indication may comprise the second color of the two-color LED.

The invention also features methods of determining the continuity and identity of two or more conductive elements in one or more groups of such elements. There is a method of accomplishing an electrical continuity test system using a tester that creates a pulsed current and has an output for connection to a local end of a first test conductive element, to inject the current pulses into the first test conductive element, an input for connection to a local end of a second test conductive element, and a visual and/or aural indication when the injected pulses are present on the second test conductive element, and further using a remote probe comprising an input for connection to a remote end of a first unidentified conductive element, an output for connection to a remote end of a second unidentified conductive element, and a visual and/or aural annunciator. This method comprises connecting the tester output and input to separate conductive elements at one end of a group of conductive elements, connecting the probe output and input to separate conductive elements at another end of the group of conductive elements, and establishing that the conductive elements to which the tester and probe are connected are the same by a first annunciation by the tester.

The method may further comprise establishing the polarity of the conductive elements to which the tester and probe are connected by a second annunciation by the tester. The first and second annunciation by the tester may comprise two different color lights. The two different color lights may be from a bi-color, bi-directional LED.

BRIEF DESCRIPTION OF THE DRAWINGS

Other objects, features and advantages will occur to those skilled in the art from the following description of the preferred embodiments, and the accompanying drawings, in which.

DESCRIPTION OF THE EMBODIMENTS OF THE INVENTION

Figure 1:
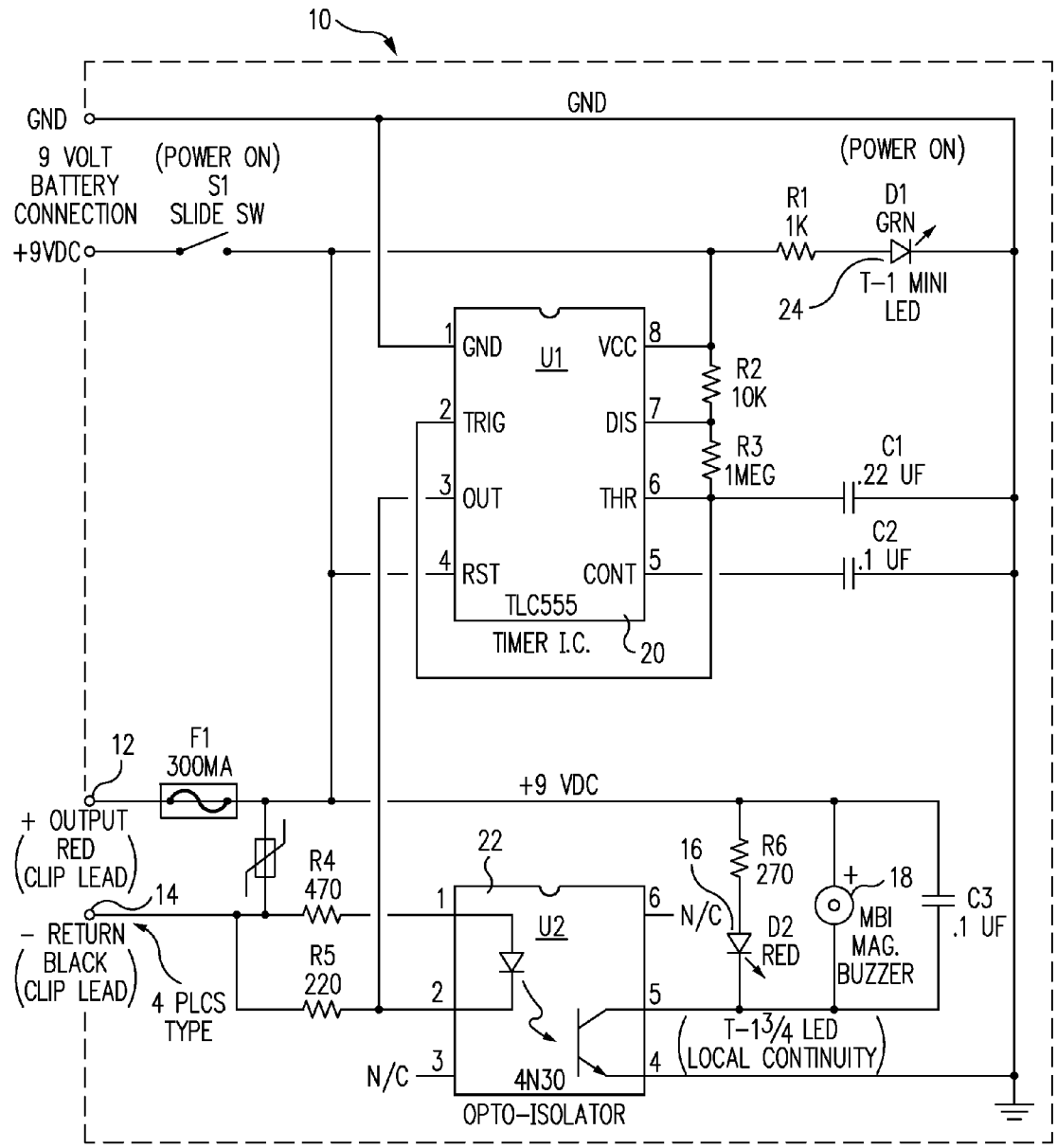
FIG. 1 is a schematic diagram of the local tester for the preferred embodiment of the invention.

The preferred embodiment includes a two-lead tester 10, FIG. 1, that injects repetitive dc current pulses into one conductive test element (such as a wire or other conductor) to which it is connected, and then detects return pulses on a second conductive test element to which it is connected. See the FIG. 1 schematic, in which the various components are labeled with identifying values and other information known to those skilled in the art. Tester 10 has output 12 to which a lead is connected for connection to a wire or other conductor. The return lead is connected to input 14. Tester 10 is powered by a 9-volt battery, not shown. LED 24 indicates that the tester is on. Timer 20 provides a series of rapid current pulses to output 12. If these pulses return through input 14, the current flow through opto-isolator 22 causes red LED 16 to flash and buzzer or tone generator 18 to sound. This indicates continuity. It would be possible to have only one annunciator rather than the two described herein.

Figure 2:
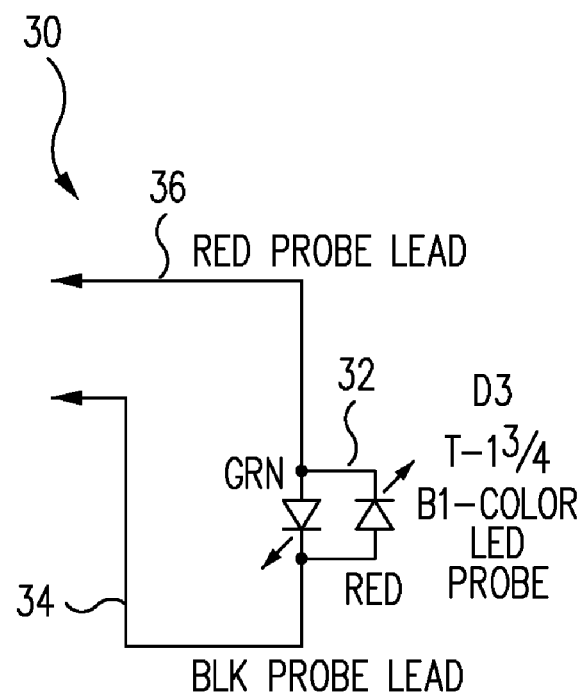
FIG. 2 is a schematic diagram of the remote probe for the preferred embodiment of the invention.
Figure 3:
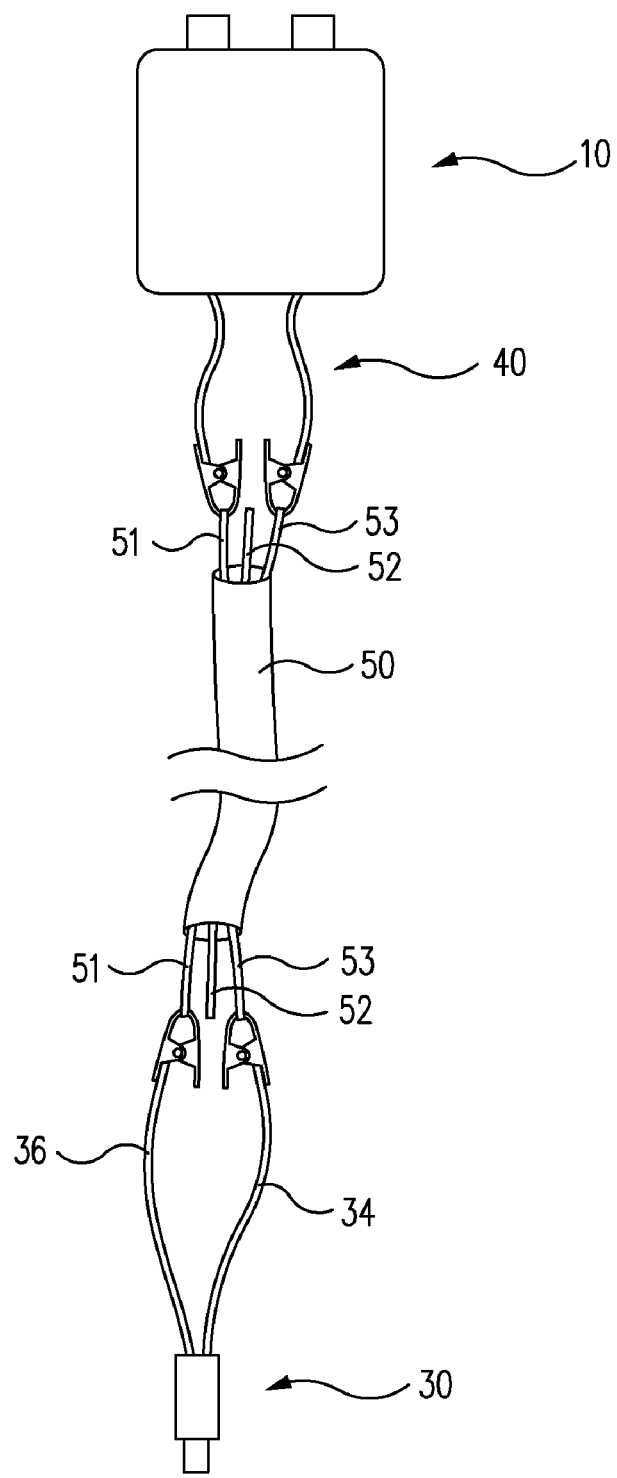
FIG. 3 is a view of the preferred embodiment in place during a continuity test.

The preferred embodiment further includes a two-lead remote probe 30, FIG. 2, that is used when the user cannot see or hear the tester. Probe 30 includes a bi-directional bi-color (red and green in the preferred embodiment) LED 32 that lights up when pulses are detected, one color for flow in one direction and the other color for flow in the opposite direction. The embodiment can be used for local or remote identification of wires or cables. FIG. 3 shows both tester 10 and probe 30 connected to wires 51 and 53 of three-wire cable 50 under test. Leads 40 connect tester 10 to cable 50, and leads 34 and 36 connect probe 30 to cable 50.

Local Testing

The inventive cable/wire identifier positively tests the electrical continuity of any two conductors within a non-powered cable (no voltage present), and thereby can be used to identify an un-marked cable out of a group of cables/wires. The tester works by injecting repetitive dc current pulses into one of the wires of a two-wire cable, in which the two wires are connected together at the remote end (either by the probe portion of the invention or by any other means). The tester then detects the return pulses from the second wire. A bright flashing LED and audible tone on the tester signals the user that continuity has been found. This is all that is required when identifying/checking wires or cables for local use; in this case, "local" means that the user is in the area of the tested circuit and can see or hear the tester unit when continuity has been made.

Figure 4:
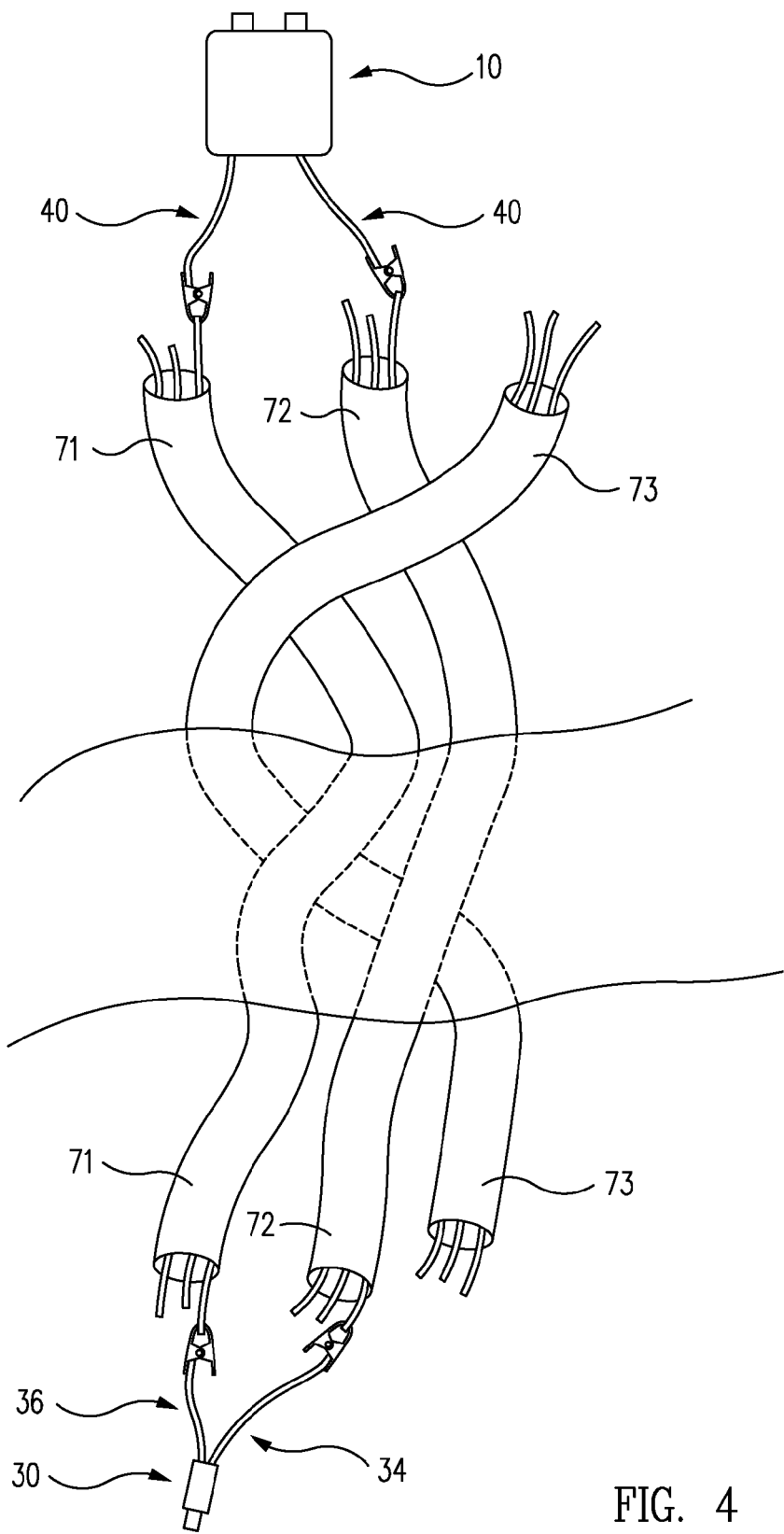
FIG. 4 is a view of the preferred embodiment in place during a test that identifies cables.

Remote Continuity, Polarity and Identification of Wires or Cables:

When attempting to identify wires or cables that leave the immediate area, where the user cannot see or hear the continuity confirmation light or buzzer being generated by the tester described above, the user can employ the remote probe of the invention. When this probe is connected to the far end of the wires or cables under test as shown in FIGS. 3 and 4, the remote probe's LED flashes either red or green, indicating continuity.

Operation:

The tester has two leads with alligator clips. In the embodiment the leads are red and black. The tester injects current into one wire. The tester flashes red when in use and continuity is detected.

The remote probe is connected to two wires at the remote end. If the current pulses are flowing through the wires to which the remote probe is connected, it will flash one of two colors, depending on the direction of current flow. In the embodiment, flashing green means that the tester and probe are connected with the same polarity, while flashing red indicates that the polarity is reversed. The flashing thus not only indicates continuity of these two wires or cables but also shows the polarity or identity of each. This added information is used to label each of the two cables under test. For example, if the remote probe is flashing green, label both ends of the cable under test according to the numbers or color on the clip leads of the tester and the remote probe. If the remote probe flashes red, label the remote end of the tested wires opposite of the remote probe clip lead numbers and color.

The polarity and continuity of three conductive elements such as wires or cable can be determined. See FIGS. 3 and 4. The tester is connected to two of the conductors. Thus, one of the three will not have current running through it. The remote probe will flash when connected to the two energized conductors, but will not flash when the third conductor is one of the pair to which the probe is connected. By alternating the connection of the probe, all three conductors can be identified.

Three cables can also be identified in a similar manner. See FIG. 4. By connecting the tester 10 to a wire of two different cables 71 and 72 as shown, the probe 30 can be used to identify those cables at the far end of the cable run. If there are three cables, the third cable 73 is also identified, as it is not involved in the successful continuity test.

The invention is not limited to any particular visual and/or aural annunciating device or methodology, in either the tester or the probe. For example, the probe could have two separate LEDs rather than a single bi-directional LED. Or, the probe could have one visual and one aural indicator. Or, the probe and/or the tester could have two aural annunciators with different sounds, such as a continuous and a discontinuous tone.

Although features of this invention are shown in some drawings and not others, this is not a limitation of the invention. Also, other embodiments would be apparent to those skilled in the art from the previous description and the following claims.

What is claimed is:

1. An electrical continuity test system, comprising:
   a) a tester, comprising:
      circuitry configured to provide a pulsed current made up of a plurality of current pulses;
      an output terminal coupled to the circuitry and configured to couple to a local end of a first test conductive element to provide the pulsed current into the first test conductive element;
      an input terminal coupled to the circuitry and configured to couple to a local end of a second test conductive element;

a visual and/or aural indicator coupled to the circuitry and configured to indicate if the pulsed current is present on the second test conductive element; wherein the circuitry comprises a timer circuit having a first terminal coupled to a positive terminal, which is couplable to a battery, and to the output terminal of the tester, and having a second terminal coupled to the input terminal of the tester; and an opto-isolator having first and second input terminals coupled to the input terminal of the tester, and a first output terminal coupled to a terminal of the visual and/or aural indicator; and b) a remote probe, comprising:

a probe input terminal configured to couple to a remote end of a first unidentified conductive element;

a probe output terminal configured to couple to a remote end of a second unidentified conductive element;

a first visual and/or aural indicator coupled to the probe input terminal and the probe output terminal; and a second visual and/or aural indicator, different from the first visual and/or aural indicator, coupled to the probe input terminal and the probe output terminal, wherein the first and second visual and/or aural indicators are configured to indicate if the first unidentified conductive element is the first or second test conductive element when the first and second unidentified conductive elements are the first and second test conductive elements, the probe input and output terminals are coupled to the first and second unidentified conductive elements, and the input and output terminals are coupled to the first and second test conductive elements.

2. The system of claim 1 in which the tester includes both visual and aural indicators.

3. The tester of claim 1 in which the opto-isolator is configured to enable the visual and/or aural indicator.

4. The tester of claim 1 in which the timer circuit comprises a timer integrated circuit.

5. The system of claim 1 in which the first visual and/or aural indicator of the remote probe comprises one color of a two-color LED.

6. The system of claim 5 in which the second visual and/or aural indicator of the remote probe comprises a second color of the two-color LED.

7. The system of claim 1, wherein the tester includes the battery.

8. The system of claim 1, wherein the visual and/or aural indicator has another terminal coupled to the output terminal of the tester, to the positive terminal, and to the first terminal of the timer circuit.

9. The system of claim 8, wherein the visual and/or aural indicator is configured to flash if the pulsed current is present on the second test conductive element, and wherein one of the first and second visual and/or aural indicators is configured to flash if the pulsed current is present on the first and second unidentified conductive elements to provide a continuity and a polarity test indication.

10. The system of claim 1, wherein the circuitry comprises:

a first resistor disposed between the first input terminal of the opto-isolator and the input terminal of the tester; and a second resistor disposed between the second input terminal of the opto-isolator and the input terminal of the tester, wherein the second resistor has a different resistance value than the first resistor.

11. The system of claim 1, wherein the circuitry comprises an LED coupled to the positive terminal to indicate if the tester is switched on.

12. A method of accomplishing an electrical continuity test using a tester that creates a pulsed current having a plurality of current pulses and has a tester output terminal for connection to a local end of a first test conductive element to provide the pulsed current into the first test conductive element, a tester input terminal for connection to a local end of a second test conductive element, and a tester visual and/or aural indicator configured to indicate when the pulsed current is present on the second test conductive element, and further using a remote probe comprising a probe input terminal for connection to a remote end of a first unidentified conductive element, a probe output terminal for connection to a remote end of a second unidentified conductive element, and a probe visual and/or aural indicator, the method comprising:

connecting the tester output and input terminals to separate test conductive elements at one end of a group of conductive elements, wherein the tester includes:

a battery;

a timer circuit having a first terminal couplable to a positive terminal of the battery and coupled to the tester output terminal, and a second terminal coupled to the tester input terminal; and an opto-isolator having a first input terminal coupled to the tester input terminal and a first output terminal coupled to a terminal of the tester visual and/or aural indicator;

connecting the probe output and input terminals to separate unidentified conductive elements at another end of the group of conductive elements; and establishing whether the test conductive elements and the unidentified conductive elements to which the tester and the probe, respectively, are connected are the same based on a response by the probe visual and/or aural indicator.

13. The method of claim 12 further comprising establishing a polarity of the conductive elements to which the tester and probe are connected based on a response by the probe visual and/or aural indicator.

14. The method of claim 13 in which the probe visual and/or aural indicator comprises two different color lights.

15. The method of claim 14 in which the two different color lights are from a bi-color, bi-directional LED.

16. The method of claim 12, wherein the probe visual and/or aural indicator is configured to provide different color lights to indicate polarity and configured to provide an aural indicator.

17. The method of claim 12, wherein the tester visual and/or aural indicator has another terminal coupled to the tester output terminal, to the positive terminal of the battery, and to the first terminal of the timer circuit.

18. The method of claim 17, wherein the tester visual and/or aural indicator flashes if the pulsed current is present on the test conductive elements, and wherein the probe visual and/or aural indicator flashes if the pulsed current is present on the unidentified conductive elements to provide a continuity and a polarity test indication.

19. The method of claim 18, wherein the tester comprises:

a first resistor disposed between the first input terminal of the opto-isolator and the tester input terminal; and a second resistor disposed between a second input terminal of the opto-isolator and the tester input terminal, wherein the second resistor has a different resistance value than the first resistor.

20. The method of claim 19, wherein the tester comprises an LED coupled to the battery to indicate if the tester is switched on.

* * * * *